(12) United States Patent
Lozhkin

(10) Patent No.: US 8,964,893 B2
(45) Date of Patent: Feb. 24, 2015

(54) PREDISTORTION APPARATUS FOR POWER AMPLIFIER

(71) Applicant: Fujitsu Limited, Kawasaki-shi, Kanagawa (JP)

(72) Inventor: Alexander Nikolaevich Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/874,414

(22) Filed: Apr. 30, 2013

(65) Prior Publication Data

US 2014/0003553 A1    Jan. 2, 2014

(30) Foreign Application Priority Data

Jun. 28, 2012    (JP) ................................ 2012-145770

(51) Int. Cl.
*H04K 1/02*    (2006.01)
*H03F 1/32*    (2006.01)

(52) U.S. Cl.
CPC ............ *H03F 1/3241* (2013.01); *H03F 1/3247* (2013.01); *H03F 1/3258* (2013.01)
USPC ........... 375/297; 375/296; 375/295; 375/316; 375/219

(58) Field of Classification Search
USPC ........................... 375/297, 296, 295, 316, 219
See application file for complete search history.

(56) References Cited

U.S. PATENT DOCUMENTS

| 8,185,065 B2 | 5/2012 | McCallister et al. |
| 2004/0155707 A1* | 8/2004 | Kim et al. .................... 330/149 |
| 2011/0092173 A1* | 4/2011 | McCallister et al. ......... 455/108 |

OTHER PUBLICATIONS

Jean Armstrong, "New OFDM Peak-to-Average Power Reduction Scheme," in Proceedings of IEEE on Vehicular Technology (2001), pp. 756-760.
Hsin-Hung Chen, et al., "Joint Polynomial and Look-Up-Table Predistortion Power Amplifier Linearization," IEEE Transactions on Circuits and Systems-II: Express Briefs, vol. 53, No. 8 (Aug. 2006), pp. 612-616.

* cited by examiner

*Primary Examiner* — Zewdu Kassa
(74) *Attorney, Agent, or Firm* — Fujitsu Patent Center

(57) ABSTRACT

A predistortion apparatus, includes a reducer to output a signal that a peak to average power ratio of an input signal is reduced by clipping, a first predistorter to generate and output a first predistortion signal from the output signal of the reducer, based on a signal obtained by removing a clipping noise caused by the clipping from the output signal of the reducer, so as to reduce energy of a residual error component obtained by removing a clipping noise caused by the clipping from an error signal included in an output of the power amplifier, a second predistorter to generate and output, by using the clipping noise, a second predistortion signal to remove a clipping noise component from the first predistortion signal, and a combiner to generate an input signal of the power amplifier obtained by combining the first predistortion signal and the second predistortion signal.

4 Claims, 4 Drawing Sheets

PREDISTORTION APPARATUS FOR POWER AMPLIFIER

CROSS-REFERENCE TO RELATED APPLICATION

This application is based upon and claims the benefit of priority of the prior Japanese Patent Application No. 2012-145770, filed on Jun. 28, 2012, the entire contents of which are incorporated herein by reference.

FIELD

Disclosure relates to a predistortion apparatus for a power amplifier.

BACKGROUND

Communication standards applied to communication systems in recent years include, for example, Division Multiple Access (W-CDMA), Long Term Evolution (LTE), Worldwide Interoperability for Microwave Access (WiMAX: IEEE802.16-2004, IEEE802.16e, etc.). Further, the communication standards may include Orthogonal Frequency Division Multiplexing Access (OFDMA).

Signals transmitted by the communication systems based on above described communication standards are wideband and have a high peak-to-average power ratio (PAPR). Generally, the signals are transmitted after amplifying by a power amplifier (PA). PAPR of the transmitted signals is reduced by clipping of the maximum signal amplitudes at the some predefined level.

For more information, see the U.S. Application Publication No. 2011/0092173 A1 (patent document 1), "J. Armstrong, "New OFDM peak-to-average power reduction scheme," in Proceedings of IEEE on Vehicular Technology, (IEEE, 2001), pp 756-760" (non-patent document 1), and "Hsin-Hung Chen, et al., "Joint Polynomial and Look-Up-Table Predistortion Power Amplifier Linearization," IEEE TRANSACTIONS ON CIRCUITS AND SYSTEMS-II: EXPRESS BRIEFS, VOL. 53, NO. 8, AUGUST 2006" (non-patent document 2).

However, the signal amplitude clipping introduces a clipping noise into the transmitted signals.

SUMMARY

An embodiment is a predistortion apparatus for a power amplifier, including:

a reducer to output a signal that a peak to average power ratio of an input signal is reduced by clipping;

a first predistorter to generate and output a first predistortion signal from the output signal of the reducer, based on a signal obtained by removing a clipping noise caused by the clipping from the output signal of the reducer, so as to reduce energy of a residual error component obtained by removing a clipping noise caused by the clipping from an error signal included in an output of the power amplifier;

a second predistorter to generate and output, by using the clipping noise, a second predistortion signal to remove a clipping noise component from the first predistortion signal; and a combiner to generate an input signal of the power amplifier obtained by combining the first predistortion signal and the second predistortion signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An embodiment will hereinafter be described with reference to the drawings. Configurations in the embodiment are an exemplification, and the invention is not limited to the configuration in the embodiment.

Communication apparatuses supporting various communication standards or systems, such as W-CDMA, WiMAX, LTE, and OFDMA include a High Power Amplifier (HPA) to amplify a signal (transmitted signal) to be transmitted. The HPA is an example of a power amplifier.

In order to provide high amplification efficiency, HPAs are operating usually with low OBO (output power back-off) in the nonlinear region. PAPR reduction is executed in order to generate an input signal of the HPA having a peak power matching the preselected OBO level. For example, PAPR of the signal to be transmitted is reduced by signal amplitude clipping based on a given level. However, by the clipping, an output signal of the HPA becomes a state including a clipping noise. The clipping noise causes an out-of-band spectral emission in the output signal of the HPA.

Figure 1:
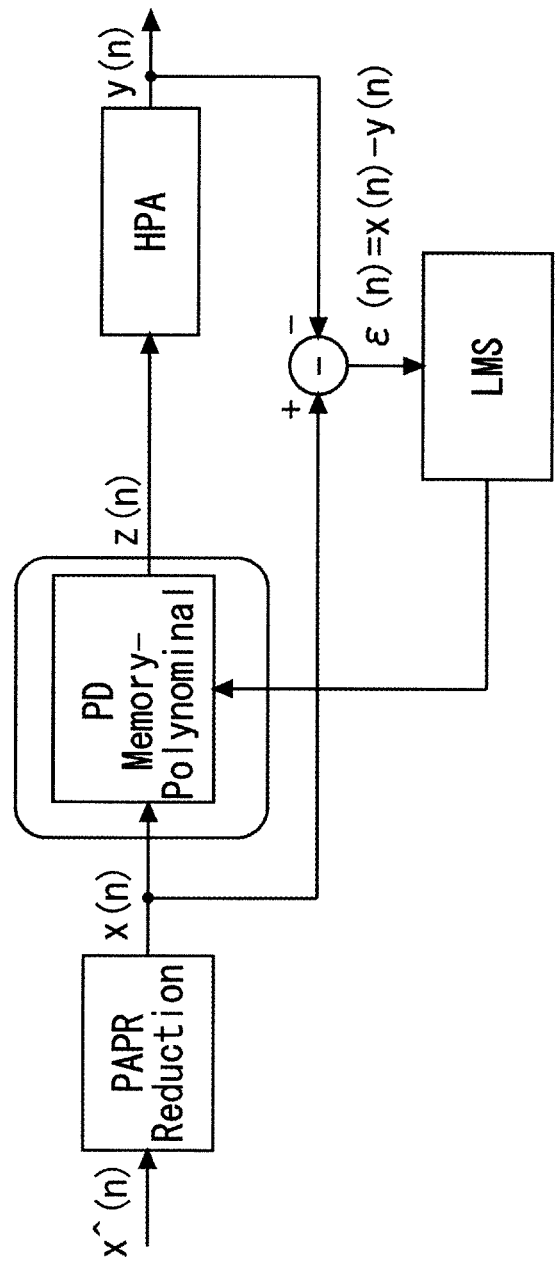
FIG. 1 is a diagram illustrating a reference example of a typical linearizer to reduce PAPR.

FIG. 1 is a diagram illustrating a reference example of atypical linearizer to reduce PAPR. In FIG. 1, the linearizer includes PAPR reducer (PAPR reduction circuit), a predistorter (PD), and an HPA that are connected series.

PAPR reducer performs clipping or clipping and filtering operation to an input signal (original signal) x^(n) to output a signal x(n) that PAPR of an input signal x^(n) is reduced. The signal x(n) is input to the PD.

The PD performs predistortion operations or processing to compensate non-linear distortion at the HPA to output a signal z(n) that is input to the HPA. The HPA operates with a non-linear mode and outputs a signal y(n) obtained by amplifying the input signal z(n).

The linearizer as illustrated in FIG. 1 further includes a subtractor, a least-means-square (LMS) algorithm. The subtractor subtracts the output signal y(n) of the HPA from the output signal x(n) of the PAPR reducer. Thus, the subtractor outputs an error signal $\epsilon(n)=x(n)-y(n)$.

The signal $\epsilon(n)$ is used by the LMS algorithm. The PD is a polynominal PD performing the predistortion operation to the signal x(n) by multiplying the signal x(n) by polynominal function. For example, the PD includes a recording medium (e.g., memory) to store parameters (correction coefficients) of polynominal and the LMS algorithm executes a training task to select parameters of polynominal. In the training task, the LMS algorithm selects the parameters to minimize energy of the error signal $\epsilon(n)$. The selected parameters (coefficients) are stored in the memory. The memory in the PD is used as a look-up table (LUT). Thus, in the linearizer in FIG. 1, the signal x(n) is used as a reference signal and the PD performs predistortion operation using appropriate polynominal parameters.

Figure 2:
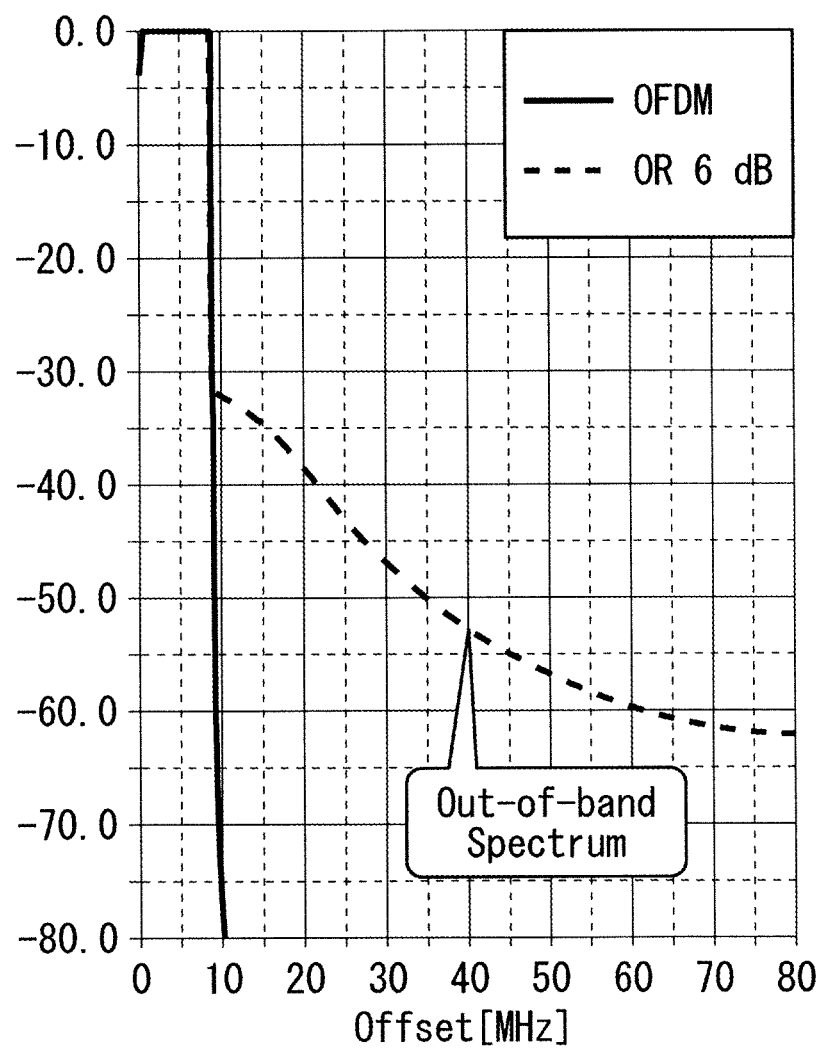
FIG. 2 is a graph exemplifies spectrums of input and output signals to/from the PAPR reducer.

As described above, PAPR reducer, for example, reduces PAPR of the signal x(n) by either clipping or clipping and filtering. The output signal x(n) of the PAPR reducer is expressed by a formula (1) below.

$$x(n)=\hat{x}(n)-\epsilon_{CL}(n) \quad (1)$$

Where $\hat{x}(n)$ is an original input signal to be transmitted, x(n) is the output signal of the PAPR reducer, and $\epsilon_{CL}(n)$ is a clipping noise signal (hereinafter, referred to as "clipping noise") caused by the PAPR reduction operation. FIG. 2 is a graph exemplifies spectrums of input and output signals to/from the PAPR reducer.

FIG. 2 illustrates the original OFDM signal $\hat{x}(n)$ (black plot) with RF bandwidth 20 MHz at the PAPR reducer input and the spectrum for the corresponding signal $\hat{x}(n)$ (gray plot) with PAPR reduced to 6 dB at the PAPR reduction output.

As depicted in FIG. 2, the out-of-band spectrum of the output signal x(n) increases by the PAPR reduction of the original signal $\hat{x}(n)$. The high level of the out-of-band spectrum causes interferences to an adjacent channel. Normally the level of the out-of-band spectrum is characterized by the Adjacent Channel Leakage Ratio (ACLR) parameter. It is preferred that the levels of ACLR and the out-of-band emission are as low as possible.

The PD suppresses the nonlinear distortion, namely out-of-band components, in order to maintain an appropriate level of the out-of-band spectrum at the HPA output. However, the residual out-of-band spectrum due to PAPR reduction cannot be suppressed with the PD as depicted in FIG. 1 because the output signal x(n) of the PAPR reducer (i.e., signal with high level of the out-of-band spectrum) acts as the reference signal for selecting the polynominal parameters at the PD. Thus, the output signal y(n) includes errors (i.e., the residual level of out-of-band components) caused by the clipping noise.

It is assumed that a discrete time n, such that $t=n \cdot \Delta t$. The objective of the PD as illustrated FIG. 1 is to find a transformation (inverse function of HPA output) from the signal x(n) to the signal z(n) expressed by a formula (2) below. In other words, the objective of the PD is generating the signal z(n) in order that the HPA may output the signal y(n) without distortions. The output signal y(n) may be expressed by a formula (3) below.

$$z(n) = HPA^{-1}(x(n)) \quad (2)$$

$$y(n) = G \cdot x(n) \quad (3)$$

The constant G in the formula (3) is the HPA gain. When the formula (2) is satisfied, a value of the constant G is one. In most practical cases, it is not possible to get the extract solution for the formula (2) (i.e., the signal z(n) establishes the formula (2)). However, the approximate solution for inverse of the HPA nonlinearity may be obtained during the direct training (selection of polynominal parameters). By the approximate solution, the signal z(n) satisfying an expression, $y(n) \approx G \cdot x(n)$, is generated. In this case, there is unobserved random error $\epsilon^*(n)$ error with mean zero in the formula (3). The error may be expressed by a formula (4) below.

$$\epsilon(n)=y(n)-x(n) \quad (4)$$

PD training task is to find polynominal parameters $\alpha_k$ (k=0, 1, 2, ..., k: k is natural numbers including 0) of polynominal (see formula (5)), which yields the predistorter (namely, determining the polynominal for the PD functioning as the predistorter). Then, the output signal z(n) of the PD is expressed by a formula (6).

$$PD(x(n)) = \alpha_0 - \alpha_1 \cdot |x(n)| - \alpha_2 \cdot |x(n)|^2 - \ldots \quad (5)$$

$$z(n) = \quad (6)$$
$$PD(x(n)) \cdot x(n) = \alpha_0 \cdot x(n) - \alpha_1 \cdot x(n) \cdot |x(n)| - \alpha_2 \cdot x(n) \cdot |x(n)|^2 - \ldots$$

When the nonlinear HPA results an undistorted signal x(n), a formula (7) below and the formula (4) ($\epsilon(n)=y(n)-x(n)$) are satisfied.

$$y(z(n))=y((\alpha_0 \cdot x(n)+\alpha_1 \cdot x(n) \cdot |x(n)|-\alpha_2 \cdot x(n) \cdot |x(n)|^2- \ldots$$
$$))=x(n) \quad (7)$$

The LMS algorithm was used to minimize an error function by adapting the power series coefficients $\alpha_k$ as described in a formula (7a) below.

$$\alpha_k=\alpha_k+\Delta\alpha_k, \Delta\alpha_k=2 \cdot \mu_k \cdot \epsilon \cdot x(n) \quad (7a)$$

The LMS algorithm converges when energy of the error $\epsilon(n)$ in the formula (4), namely $\|\epsilon(n)\|$, is minimized. The PD input signal x(n) in the formulas (5) to (7) is the undistorted signal and "$\epsilon(n)$" in the formula (4) is the error signal caused by the approximate solution in the formula (2). The target function of the parameters $\alpha_k$ adjusted in the formula (5) to (7) is the minimization of the error signal energy $\|\epsilon(n)\|$. By the above-described adjusting the polynominal PD coefficient $\alpha_k$, the level of the out-of-band spectrum components is minimized. When the error signal $\epsilon(n)$ is zero, the formula (2) is completely satisfied and the perfect solution (the perfect HPA linearization) is realized. However, according to the formula (1), the output signal y(n) is expressed by a following formula (8).

$$y(n)=x(n)=\hat{x}(n)-\epsilon_{CL}(n) \quad (8)$$

Thus, the output signal y(n) after linearization still has a clipping noise term $\epsilon(n)$ that causes the spectral regrowth and out-of-band spectrum. Thus the polynomial coefficients $\alpha_k$ in the formula (5) that are minimizing the energy $\|\epsilon(n)\|$ does not automatically guarantees the spectral regrowth and the out-of-band spectrum minimization. The error signal $\epsilon(n)$ is expressed by formulas (9) and (10) below.

$$\epsilon(n)=y(n)-x(n)=y(n)-\hat{x}(n)+\epsilon_{CL}(n) \quad (9)$$

$$\epsilon'(n)=\epsilon(n)-\epsilon_{CL}(n)=y(n)-\hat{x}(n) \quad (10)$$

In the formula (10), "$\epsilon'(n)$" is a residual error term to be minimized with the appropriate PD's coefficients $\alpha_k$ selection. The residual error $\epsilon'(n)$ is obtained by subtracting the clipping noise $\epsilon_{CL}(n)$ from the error $\epsilon(n)$.

Thus, the HPA output signal that is more close to the original signal to be transmitted $\hat{x}(n)$ and that has better out-of-band spectrum component suppression might be obtained if find parameters $\alpha_k$ of the polynomial PD (formula (5)) to minimize the total error energy $\|\epsilon(n)\|$.

In the embodiment, the error term $\epsilon'(n)$ in the formula (10) is minimized instead of the minimization only the energy of the HPA inverse transfer function approximation error $\epsilon(n)$.

Figure 3:
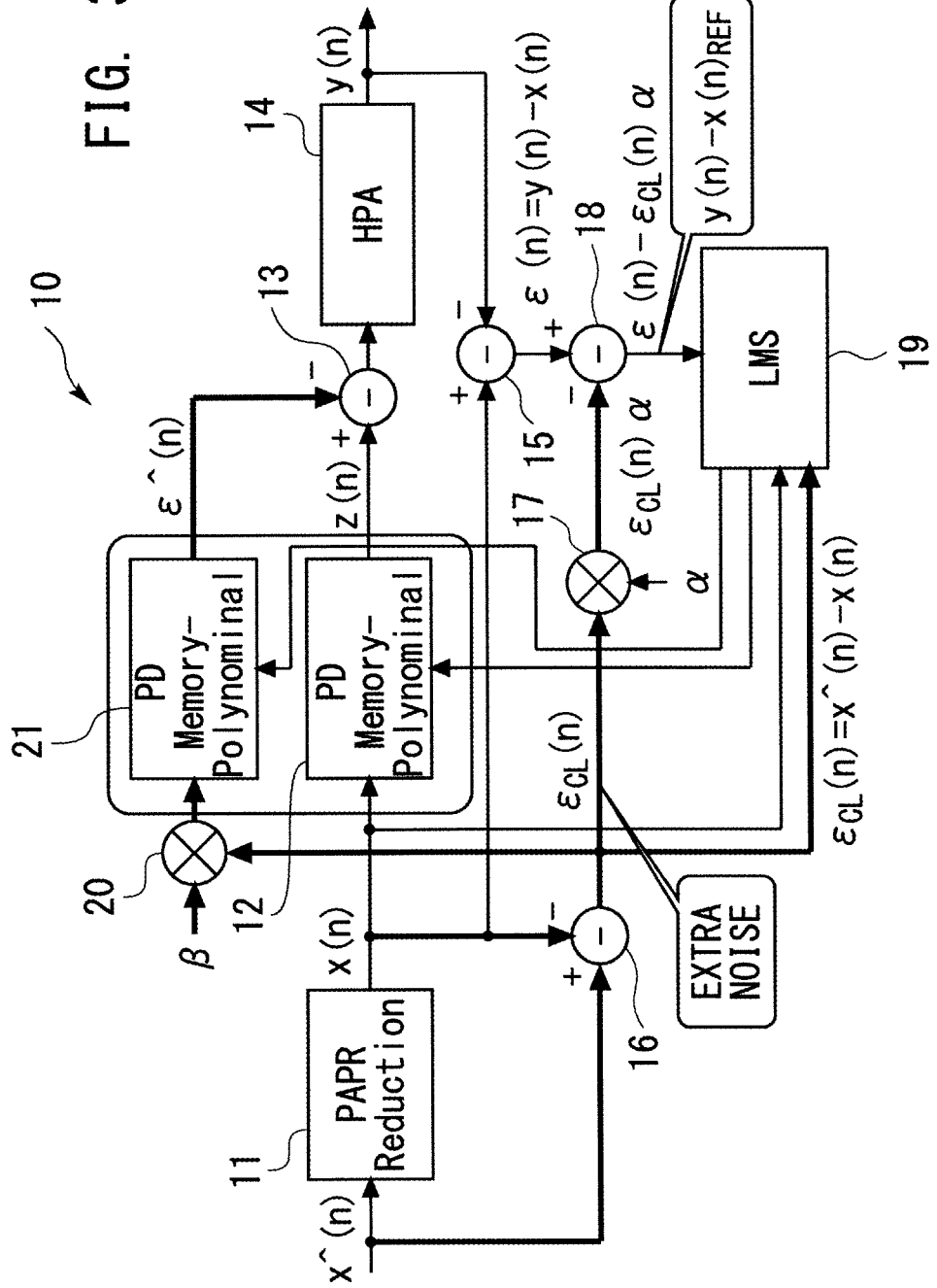
FIG. 3 illustrates a configuration example of the embodiment of the predistortion apparatus (linearizer).

FIG. 3 illustrates a configuration example of the embodiment of predistortion apparatus (linearizer 10). In FIG. 3, the linearizer 10 includes a PAPR reducer (PAPR reduction circuit) 11, a predistorter (first PD) 12 connected with the PAPR reducer 11, a subtractor 13 connected to the first PD 12. The subtractor 13 is connected with a power amplifier (HPA) 14. The linearizer 10 further includes a subtractor 15, a subtractor 16, a multiplier 17, a subtractor 18, a LMS processor 19, a multiplier 21, and a PD (second PD) 21. The subtractor 13 is an example of a combiner, the subtractor 15, the subtractor 16, the subtractor 18 and the multiplier 17 are an example of a reference signal generating circuit, and the multiplier 17 and the multiplier 20 are an example of weighting circuits. The subtractor 13, the subtractor 15, the subtractor 16, the subtractor 18, the multiplier 17, and the multiplier 20 are an example of calculators to obtain intended signals. The configuration of calculators (hardware logic) to obtain the intended signals in the embodiment is not limited in FIG. 3.

For example, each of elements (blocks) other than the HPA 14 illustrated in FIG. 3 is one or more functions obtained by execution of program(s), which is stored in a recoding medium, of a processor (e.g., central processing unit (CPU), digital signal processor (DSP), and the like). However, the function obtained by each of the elements may obtain by two or more processors. The function obtained by each of the elements is realized by application of dedicated or generalized hardware. The hardware is at least one of electric circuits, electronic circuits, Integrated Circuit (IC), Large Scale Integrated Circuit (LSI), Application Specific Integrated Circuit (ASIC), Logic Programmable Device (LPD), and their combination. The LPD is, for example, Field-Programmable Gate Array (FPGA). The function obtained by each of the elements may be realized by corresponding one or more hardware chip(s) or circuit(s). The HPA 14 is formed by e.g., electric circuit(s), electronic circuit(s), and their combination. For example, the HPA 14 is formed by one or more high-power transistors.

The PAPR reducer 11 performs, for example, clipping or clipping and filtering in order to output the PAPR reduction signal x(n) of which PAPR of the input signal (original signal) x^(n) is reduced. The first PD 12 performs the predistortion by multiplying the signal x(n) by the polynominal to output the signal z(n). The signal z(n) is inputted to the subtractor 13.

The output signal of the subtractor 13 is inputted to the HPA 14. The HPA 14 outputs the signal y(n). the output signal x(n) of the PAPR reducer 11 and the output signal y(n) of the HPA 14 are inputted to the subtractor 15 . The output signal y(n) is inputted to the subtractor 15 after analog-to-digital conversion by an analog-to-digital converter (ADC, not illustrated).

The subtractor 15 outputs the error signal c(n) by subtracting the signal x(n) from the signal y(n). The error signal c(n) is input to the subtractor 18.

The subtractor 16 receives the original signal x^(n) and the signal x(n) to output the clipping noise $\epsilon_{CL}(n)$ obtained by subtracting the signal x(n) from the signal x^(n). The clipping noise $\epsilon_{CL}(n)$ is inputted to the multiplier 17.

The multiplier 17 multiplies the clipping noise $\epsilon_{CL}(n)$ by the weight factor α. The output signal $\epsilon_{CL}(n)$ a from the multiplier 17 is inputted to the subtractor 18. The subtractor 18 subtracts the value of $\epsilon_{CL}(n)$ a from the error signal c(n) to input the calculation result ($\epsilon(n)-\epsilon_{CL}(n)\alpha$) to the LMS processor 19.

The LMS processor 19 executes a training task based on the LMS algorithm. The LMS algorithm is an example of adaptive algorithm to select polynominal coefficients (to determine polynominal) used by the PD. For example, the LMS algorithm described in the non-patent document 2 may be applied to the embodiment. The LMS processor 19 is an example of a controller (control device) for a predistorter (PD).

The LMS processor 19 selects coefficients $\alpha_k$ for the signal x(n) through the training task to store the coefficients $\alpha_k$ in a recoding medium (e.g., memory) included in the first PD 12. The first PD 12 uses the memory as a look up table (LUT). The LMS processor 19, by the repeat of the training task, updates the coefficients in the LUT during a given period of time (e.g., Δt).

The LMS processor 19 also selects polynominal coefficients $\beta_k$ used by the second PD 21 to store the selected coefficients $\beta_k$ in a look-up table (LUT) on a storage medium (e.g., memory) included in the second PD 21. The selection of coefficients $b_k$ is periodically executed at a given period of time (e.g., Δt), then the coefficients $\beta_k$ in the LUT is updated.

The LMS processor 19 receives the signal x(n), the clipping noise $\epsilon_{CL}(n)$, and the signal ($\epsilon(n)-\epsilon E_{CL}(n)\alpha$). The LMS processor 19 generates a reference signal $x(n)_{REF}$ from the received signals and executes, by execution of the LMS algorithm, processing for selecting polynominal coefficients $\alpha_k$ for the first PD 12 performing the predistortion operation to the signal x(n) (generating the signal z(n)).

The clipping noise $\epsilon_{CL}(n)$ is also inputted to the multiplier 20. The multiplier 20 multiplies the clipping noise $\epsilon_{CL}(n)$ by a parameter (weight) β. The calculation result, namely $\epsilon_{CL}(n)$ β is inputted to the second PD 21. The second PD 21 performs the predistortion operation (multiplying polynominal) to the input signal $\epsilon_{CL}(n)$ β under control of the LMS processor 19 to output a signal $\hat{\epsilon}(n)$ obtained by the predistortion. At the subtractor 13, the signal $\hat{\epsilon}(n)$ is subtracted from the signal z(n). The output signal ($z(n)-\hat{\epsilon}(n)$) of the subtractor 13 is inputted to the HPA 14 after digital-to-analog conversion by an digital-to-analog converter (DAC, not illustrated). The HPA 14 amplifies the signal ($z(n)-\hat{\epsilon}(n)$) to output the signal y(n). The values of weights α and β are automatically changed by, for example, the LMS processor 19.

In the embodiment, a reference signal $x(n)_{REF}$ instead of the signal x(n) is used for the training process (selection of parameters $\alpha_k$) in the first PD 12. The reference signal $x(n)_{REF}$ is expressed by the following formula (11).

$$x(n)_{REF} = x(n) - \alpha \cdot \epsilon_{CL}(n) \qquad (11)$$

By use of the reference signal $x(n)_{REF}$, a signal expressed by a formula (12) is inputted to the LMS processor 19. Execution of the LMS algorithm leads minimization of the residual error $\epsilon'(n)$.

$$y(n) - x(n)_{REF} = y(n) \cdot x(n) + \alpha + \epsilon_{CL}(n) = \epsilon + \alpha \cdot \epsilon_{CL}(n) \qquad (12)$$

Meanwhile, the first PD 12 is not the linear system, therefore, it is difficult to simply remove $\beta \cdot \epsilon_{CL}(n)$ term from the signal x(n) in order to compensate the clipping noise $\epsilon_{CL}(n)$ by the input of the HPA 14. Hence, the multiplier 20 and the second PD 21 are provided. That is, the linearizer 10 includes the first PD 12 to provide the predistortion to the signal x(n) and the second PD 21 to provide the predistortion to the input signal $\epsilon_{CL}(n)\beta$. The first PD 12 is an example of a first predistorter, and the second PD 21 is an example of a second predistorter.

The signal z(n) being the output signal of the first PD 12 is defined by the above-described formula (6). On the other hand, the signal $\hat{\epsilon}(n)$ being the output signal of the second PD 21 is defined by a formula (13) as follows.

$$\hat{\phi}(n) = PD(\epsilon_{CL}(n)) \cdot \epsilon_{CL}(n) = b_0 \cdot \epsilon_{CL}(n) \cdot |x(n)| - b_2 \cdot \epsilon_{CL}(n) \cdot |x(n)|^2 - \qquad (13)$$

Each of signals transmitted and received in the linearizer 10 as depicted in FIG. 3 are exemplified below. The output of the PAPR reducer 11 may be expressed by a formula (14) below. Where $\hat{x}(n)$ is an original signal to be transmitted in the formula (1) and $\epsilon_{CL}(n)$ is the clipping noise to be removed.

$$x(n) = \hat{x}(n) - \epsilon_{CL}(n) \quad (14)$$

For example, the polynominal PD, namely the first PD 12, has the polynominal having the second order as expressed by a formula (15) below. The formula (15) is an exemplification of the polynominal. The output signal $z(n)$ as a reaction for input (the signal $x(n)$) maybe expressed by a formula (16) below. The signal $z(n)$ maybe also expressed by a formula (16a) by using the formula (14). The polynominal coefficients $\alpha_k$ are polynomial coefficients which are calculated during the training by the LMS processor 19. The output signal $\hat{\epsilon}(n)$ of the second PD 21 may be expressed by a formula (17). And the input signal of the HPA 14 is expressed by a formula (18).

$$PD(x(n)) = \alpha_0 - \alpha_1 \cdot |x(n)| - \alpha_2 \cdot |x(n)|^2 \quad (15)$$

$$z(n) = \alpha_0 \cdot x(n) = \alpha_1 x(n) \cdot |x(n)| - \alpha_2 \cdot x(n) \cdot |x(n)|^2 \quad (16)$$

$$z(n) = \alpha_0 \cdot \hat{x}(n) - \alpha_0 \cdot \varepsilon_{CL}(n) - \alpha_1 \cdot \hat{x}(n) \cdot |x(n)| - \quad (16a)$$
$$\alpha_1 \cdot \varepsilon_{CL} \cdot |x(n)| - \alpha_2 \cdot \hat{x}(n) \cdot |x(n)|^2 - \alpha_2 \cdot \varepsilon_{CL}(n) \cdot |x(n)|^2$$

$$\hat{\varepsilon}(n) = b_0 \cdot \beta \cdot \varepsilon_{CL}(n) - b_1 \cdot \beta \cdot \varepsilon_{CL}(n) \cdot |x(n)| - b_2 \cdot \beta \cdot \varepsilon_{CL}(n) \cdot |x(n)|^2 \quad (17)$$

$$z(n) - \hat{\varepsilon}(n) = \alpha_0 \cdot \hat{x}(n) - \alpha_0 \cdot \varepsilon_{CL}(n) - b_0 \cdot \beta \cdot \varepsilon_{CL}(n) - \quad (18)$$
$$\alpha_1 \cdot \hat{x}(n) \cdot |x(n)| - \alpha_1 \cdot \varepsilon_{CL} \cdot |x(n)| - b_1 \cdot \beta \cdot \varepsilon_{CL}(n) \cdot |x(n)| -$$
$$\alpha_2 \cdot x(n) \cdot |x(n)|^2 - \alpha_2 \cdot \varepsilon_{CL}(n) \cdot |x(n)|^2 - b_2 \cdot \beta \cdot \varepsilon_{CL}(n) \cdot |x(n)|^2$$

The signal $z(n)$ is an exemplification of a first predistortion signal and the signal $\hat{\epsilon}(n)$ is an exemplification of a second predistortion signal.

The linear term in the formula (18) is expressed by a formula (19). Assuming that polynomials coefficients are the same (i.e., $\alpha_0 = b_0$; $\alpha_1 = b_1$, . . . , etc.), the error term in the formula (19) is expressed by a formula (20).

$$\text{Linear}\{z(n)-\hat{\epsilon}(n)\} = \alpha_0 \cdot \hat{x}(n) - \alpha_0 \cdot \epsilon_{CL}(n) - b_0 \cdot \beta \cdot \epsilon_{CL}(n)$$
$$= \alpha_0 \cdot \hat{x}(n) - \epsilon_{CL}(n) \cdot (\alpha_0 + b_0 \cdot \beta) \quad (19)$$

$$\epsilon_{CL}(n) \cdot (\alpha_0 - b_0 \cdot \beta) = \epsilon_{CL}(n) \cdot \alpha_0 \cdot (1+\beta) \quad (20)$$

The error term may be minimized by selecting parameter 13. A range of the parameter 13 is from −1 to 0 (−1≤β≤0). Thus, by the formula (20), it become clear that the linear term in the input of the HPA 14 is the original signal $\hat{x}(n)$ without the clipping noise $\epsilon_{CL}(n)$ when a value of the parameter 13 is −1. Thus, according to the embodiment, it is possible to reduce or suppress the clipping noise $\epsilon_{CL}(n)$ by the coefficient $(1+\beta)$.

Figure 4:
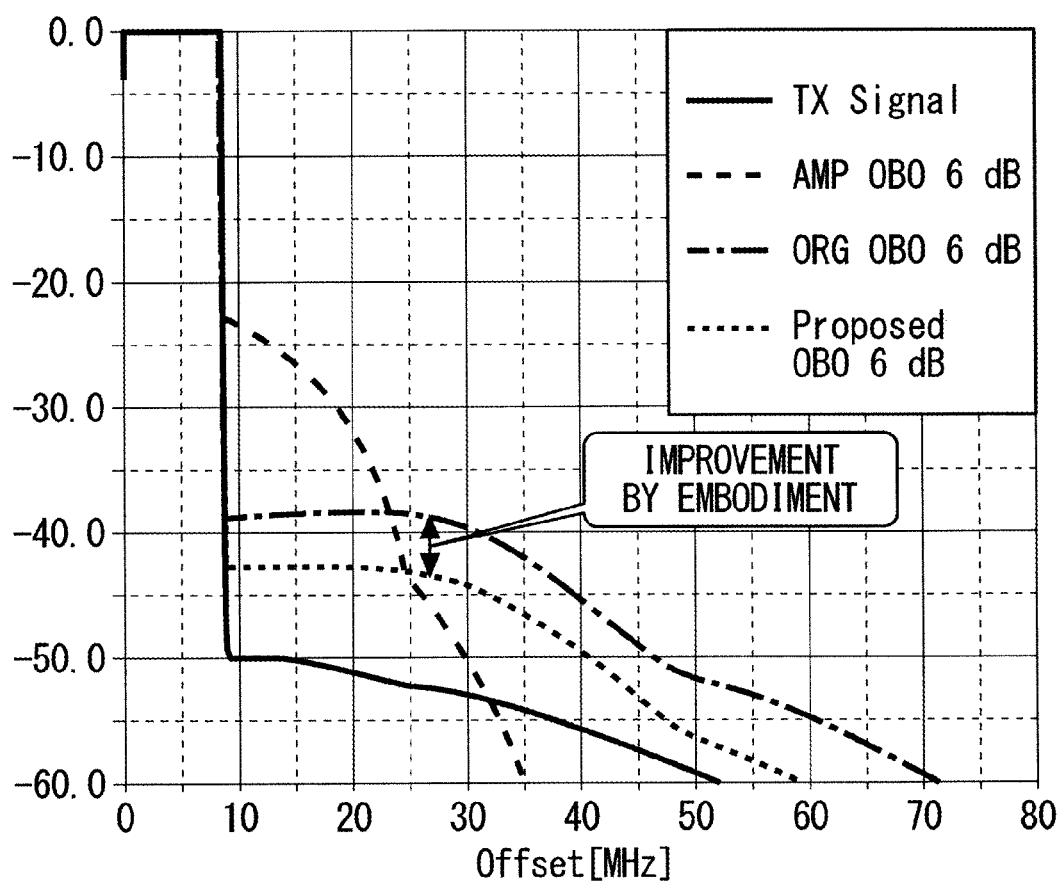
FIG. 4 is a graph illustrating the spectrums for the HPA output signal in the embodiment and the comparison examples.

FIG. 4 is a graph illustrating the spectrum for the HPA output signal in the embodiment and the comparison examples. The HPA has been described by memory polynomial model HPA operating with 6 dB output power back-off (OPBO). The plot marked as "TX signal" indicates spectrum for the signal x(n) to be transmitted with PAPR 6 dB after four clipping-and-filtering iterations. Plots marked as "AMP OBO 6 dB" indicate the HPA output signal spectrum without any linearization. Plots marked as "ORG OBO 6 dB" indicate the HPA output signal spectrum for the reference example (standard solution) as depicted in FIG. 1. Plots marked as "Proposed OBO 6 dB" indicate the HPA output signal spectrum for the embodiment. As depicted in FIG. 4, the linearizer 10 of the embodiment may provide better out-of-band spectrum suppression.

According to the embodiment, by the LMS processor 19 (predistortion controller), the selection of the polynominal coefficients $\alpha_k$ (determining of the polynominal function) based on the reference signal $x(n)_{REF}$ is performed in order to minimize the residual error $\epsilon'(n)$. Thus, the energy of the residual error $\epsilon'(n)$ in the output of the HPA 14 is suppressed and the clipping noise and the out-of-band spectrum in the output of the HPA 14 is reduced. Further, the second PD 21 generates the predistortion signal $\hat{\epsilon}(n)$ from the weighted clipping noise $\epsilon_{CL}(n)\beta$ and the second predistortion signal $\hat{\epsilon}(n)$ is subtracted from the first predistortion signal z(n) (the signal z(n) and the signal $\hat{\epsilon}(n)$ are combined). Thus, the clipping noise $\epsilon_{CL}(n)$ is removed from the input of the HPA 14. Thereby, the out-of-band spectrum is reduced.

In the embodiment, the weights a and p for the clipping noise may be adjusted automatically (or manual) in order to minimize at least one of out-of-band spectrum of the HPA output signal, error vector magnitude of the HPA output signal, and weighted sum of the HPA output signal error vector magnitude and signal power in ACLR.

In the exemplification illustrated in FIG. 4, the input signal $\hat{x}(n)$ is the OFDM signal. However, the input signal is not limited to the OFDM signal. For example, various signals used in the above-described communication systems (e.g., W-CDMA, WiMAX, LTE, etc.) may be applied as the input signal $\hat{x}(n)$.

The above-described embodiment discloses a generating method to generate a signal inputted to the power amplifier by the predistortion apparatus. The above-described embodiment also discloses and a program and a non-transitory computer-readable recoded medium storing the program to realize functions of the predistortion apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A predistortion apparatus for a power amplifier, comprising:
   a reducer to output a signal that a peak to average power ratio of an input signal is reduced by clipping;
   a first predistorter to generate and output a first predistortion signal from the output signal of the reducer, based on a signal obtained by subtracting a clipping noise signal, which is obtained by subtracting the output signal of the reducer from the input signal of the reducer, from the output signal of the reducer, so as to reduce energy of a residual error component obtained by removing the clipping noise signal from an error signal included in an output of the power amplifier;
   a second predistorter to generate and output, by using the clipping noise signal, a second predistortion signal to remove the clipping noise signal included in the first predistortion signal; and
   a combiner to generate an input signal of the power amplifier obtained by combining the first predistortion signal and the second predistortion signal.

2. The predistortion apparatus according to claim 1, wherein the first predistorter and the second predistorter are a polynominal predistorter to generate the first predistortion signal and the second predistortion signal by an input signal thereof by a polynominal function; and the predistortion apparatus further comprising a predistortion controller to determine polynominal used by each of the first predistorter and the second predistorter based on a weighted clipping noise signal.

3. The predistortion apparatus according to claim 2, wherein the predistortion controller determines the polynominal used by the first predistorter by using a reference signal obtained by subtracting the weighted clipping noise signal from the output signal of the reducer.

4. A generating method of an input signal for the power amplifier, comprising:

outputting, by using a reducer, a signal that a peak to average power ratio of an input signal is reduced by clipping;

generating and outputting, by using a first predistorter, a first predistortion signal from the output signal of the reducer, based on a signal obtained by subtracting a clipping noise signal, which is obtained by subtracting the output signal of the reducer from the input signal of the reducer, from the output signal of the reducer, so as to reduce energy of a residual error component obtained by removing the clipping noise signal from an error signal included in an output of the power amplifier;

generating and outputting, by using a second predistorter, a second predistortion signal to remove the clipping noise signal included in the first predistortion signal based on the clipping noise signal; and generating, by using a combiner, an input signal of the power amplifier obtained by combining the first predistortion signal and the second predistortion signal.

* * * * *